(12) United States Patent
Kim et al.

(10) Patent No.: US 10,505,011 B2
(45) Date of Patent: Dec. 10, 2019

(54) APPARATUS AND METHOD OF FABRICATING LIGHTING APPARATUS USING ORGANIC LIGHT EMITTING DEVICE

(71) Applicant: LG Display Co., Ltd., Seoul (KR)

(72) Inventors: Namkook Kim, Suwon-si (KR); Jejun Park, Seoul (KR); Seunglyul Lee, Paju-si (KR); Taejoon Song, Paju-si (KR); Shinbok Lee, Seoul (KR); Kyunghoon Lee, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 112 days.

(21) Appl. No.: 15/687,053

(22) Filed: Aug. 25, 2017

(65) Prior Publication Data

US 2018/0151687 A1 May 31, 2018

(30) Foreign Application Priority Data

Nov. 28, 2016 (KR) .................. 10-2016-0159700

(51) Int. Cl.
| | |
|---|---|
| H01L 21/02 | (2006.01) |
| H01L 29/66 | (2006.01) |
| H01L 21/027 | (2006.01) |
| H01L 51/00 | (2006.01) |

(52) U.S. Cl.
CPC .... *H01L 29/66022* (2013.01); *H01L 21/0271* (2013.01); *H01L 51/0011* (2013.01); *H01L 51/0031* (2013.01); *H01L 2221/1068* (2013.01); *H01L 2221/68381* (2013.01); *H01L 2251/562* (2013.01); *Y02E 10/549* (2013.01)

(58) Field of Classification Search
CPC ................. H01L 21/0271; H01L 2221/1068
See application file for complete search history.

(56) References Cited

U.S. PATENT DOCUMENTS

| | | | | |
|---|---|---|---|---|
| 2005/0116658 A1* | 6/2005 | Kato | ................... | H01L 27/3288 315/169.3 |
| 2008/0171422 A1* | 7/2008 | Tokie | ................... | H01L 51/001 438/479 |
| 2012/0282411 A1* | 11/2012 | Kurokawa | ........... | D01D 5/0076 427/462 |

FOREIGN PATENT DOCUMENTS

| | | |
|---|---|---|
| CN | 1622704 A | 6/2005 |
| CN | 101578718 A | 11/2009 |

OTHER PUBLICATIONS

Extended European Search Report dated Apr. 18, 2018 in a corresponding application EP 17 20 2024.0.
Office Action issued by China National Intellectual Property Office in Chinese Application No. 201711212754.3 dated Sep. 27, 2019.

* cited by examiner

*Primary Examiner* — Robert A Vetere
(74) *Attorney, Agent, or Firm* — Polsinelli PC (57) ABSTRACT

A film having a plurality of lighting devices thereon is transferred between a film supplying roll and a film collecting roll, and an organic light emitting layer and a second electrode are formed on the film being transferred from a deposition unit. An aging unit is provided on a rear end of the deposition unit, and applies an aging voltage to the film transferred after the organic light emitting layer is deposited by the deposition unit, thereby aging the organic light emitting layer.

9 Claims, 7 Drawing Sheets

APPARATUS AND METHOD OF FABRICATING LIGHTING APPARATUS USING ORGANIC LIGHT EMITTING DEVICE

CROSS-REFERENCE TO RELATED APPLICATION

Pursuant to 35 U.S.C. § 119(a), this application claims the benefit of an earlier filing date of and the right of priority to Korean Application No. 10-2016-0159700, filed on Nov. 28, 2016, the contents of which are incorporated by reference herein in its entirety.

BACKGROUND

Field of the Disclosure

The present disclosure relates to a display device, and more particularly, to an apparatus and a method for fabricating a lighting apparatus using an organic light emitting device, capable of simplifying fabrication processes.

Description of the Background

Recently, a fluorescent lamp or an incandescent lamp is mainly used as a lighting device. The incandescent lamp has a very high color rendering index, but has very low energy efficiency. On the other hand, the fluorescent lamp has high efficiency, but has a low color rendering index. Further, since the fluorescent lamp contains mercury, it causes environmental problems.

In order to solve the problems of the conventional lighting device, a light emitting diode (LED) has been recently proposed as a lighting device. The LED is formed of an inorganic light emitting material, and has highest light emitting efficiency at a blue wavelength range. The LED has its light emitting efficiency lowered toward a red wavelength range and a green wavelength range which has highest luminous efficiency. However, in generating white light by combining a red (R) LED, a green (G) LED and a blue (B) LED with each other, light emitting efficiency canbe lowered. Further, in case of using the RGB LEDs, a color rendering index is lowered because a light emitting peak of each of the RGB LEDs has a narrow width.

In order to solve such a problem, a lighting apparatus which outputs white light by combining a blue LED with a yellow fluorescent body, instead of combining RGB LEDs with one another has been proposed. The reason is because using only a blue LED having high light emitting efficiency and using a fluorescent material which emits a yellow light by receiving a blue light is more efficient than using a green LED having low light emitting efficiency.

However, in case of such a lighting device which outputs white light by combing a blue LED with a yellow fluorescent body, a fluorescent material which emits a yellow light does not have high light emitting efficiency. As a result, there is a limitation in enhancing light emitting efficiency of the lighting device.

SUMMARY

Therefore, an aspect of the detailed description is to provide a method of fabricating a lighting device using an organic light emitting device which has high light emitting efficiency and which emits light similar to solar light.

Another aspect of the detailed description is to provide a lighting device capable of being fabricated rapidly and capable of enhancing a yield by being preventing from being entirely dark spotted or non-driven, by making only a foreign material region having foreign materials generated from an organic light emitting layer during a roll to roll process, dark-spotted through an aging process, and a method for fabricating a lighting apparatus using the same.

To achieve these and other advantages and in accordance with the purpose of this specification, as embodied and broadly described herein, there is provided an apparatus for fabricating a lighting apparatus, wherein a film having a plurality of lighting devices thereon is transferred between a film supplying roll and a film collecting roll, and an organic light emitting layer and a second electrode are formed on the film being transferred from a deposition unit. An aging unit is provided on a rear end of the deposition unit, and applies an aging voltage to the film transferred after the organic light emitting layer is deposited by the deposition unit, thereby aging the organic light emitting layer.

The aging unit comprises: an aging roller which contacts aging pads of the lighting apparatus; and a supporting roller which contacts the aging roller. The film is disposed between the aging roller and the supporting roller, and the aging roller always contacts the aging pads as the aging roller and the supporting roller are rotated when the film is transferred.

The aging roller comprises: a rotation shaft which is rotated as the film is transferred; a roll head disposed at both ends of the rotation shaft; and a metallic pattern disposed along a circumferential surface of the roll head, and formed to contact the aging pads of the lighting apparatus.

An open mask is disposed on a front surface of the film to deposit only a preset region of the film. The open mask is transferred in a synchronized manner with the film, and is aligned with the film.

To achieve these and other advantages and in accordance with the purpose of this specification, as embodied and broadly described herein, there is also provided a method for fabricating a lighting apparatus, comprising: supplying a film; forming in real time, an organic light emitting layer, a second electrode and a second aging pad on a plurality of regions of the film transferred between a film supplying roll and a mask roll; consecutively applying an aging voltage to the organic light emitting layers formed on the film transferred between the film supplying roll and the mask roll; depositing a sealant on the film; and cutting the film thereby separating the film into a plurality of lighting devices.

In the present disclosure, since a ductile material is used as a substrate, roll to roll processes can be performed. This can allow a lighting apparatus to be fabricated rapidly.

Further, in the present disclosure, the aging unit is provided at a rear end of the deposition unit which consecutively deposits an organic light emitting material on the film transferred, and the aging unit includes rollers. When the film is transferred, the aging roller is always in a contacted state with the aging pads of the film, thereby applying an aging voltage to the lighting apparatus. This may allow the organic light emitting layer to be formed, and may allow an aging process of the organic light emitting layer to be performed in real time and consecutively. As a result, entire fabrication processes of the lighting apparatus are simplified, resulting in fabricating the lighting apparatus rapidly and cheaply.

Further scope of applicability of the present application will become more apparent from the detailed description given hereinafter. However, it should be understood that the detailed description and specific examples, while indicating preferred aspects of the disclosure, are given by way of illustration only, since various changes and modifications within the spirit and scope of the disclosure will become apparent to those skilled in the art from the detailed description.

BRIEF DESCRIPTION OF THE DRAWINGS

The accompanying drawings, which are included to provide a further understanding of the disclosure and are incorporated in and constitute a part of this specification, illustrate exemplary aspects and together with the description serve to explain the principles of the disclosure.

In the drawings.

DETAILED DESCRIPTION

Hereinafter, the present disclosure will be explained in more detail with reference to the attached drawings.

The present disclosure provides a lighting apparatus including an organic light emitting device formed of an organic material, not a lighting apparatus including an inorganic light emitting device formed of an inorganic material.

An organic light emitting device formed of an organic material has more excellent green and red light emitting efficiency, than an inorganic light emitting device. Further, the organic light emitting device has a relatively wider width of RGB light emitting peaks, than the inorganic light emitting device. Accordingly, the organic light emitting device has an enhanced color rendering index, thereby having an advantage that its light is more similar to solar light.

Figure 1:
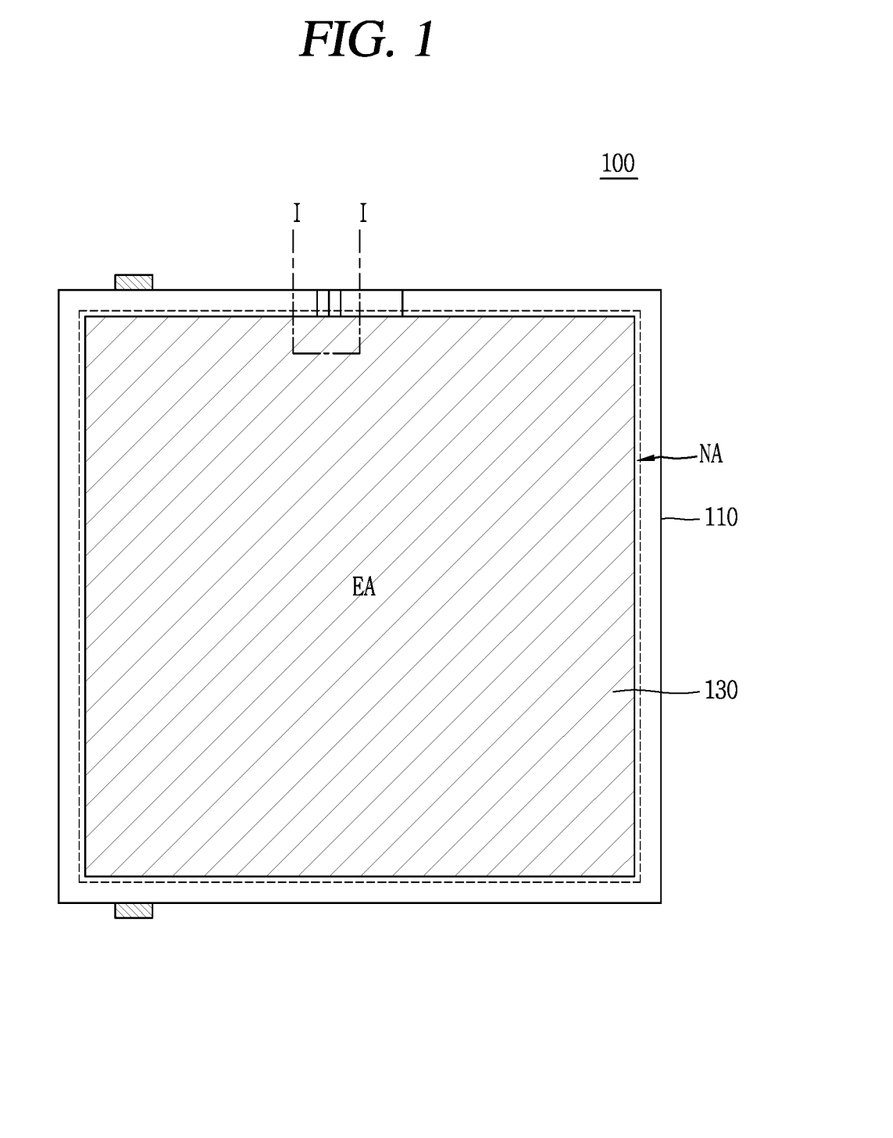
FIG. 1 is a plan view of a lighting device according to the present disclosure.

FIG. 1 is a view showing a structure of a lighting apparatus using an organic light emitting device according to the present disclosure.

As shown in FIG. 1, the lighting device 100 according to the present disclosure, a surface emitting lighting apparatus, is implemented as a substrate 110 including a lighting portion (EA) for emitting light substantially and outputting the light to the outside, and an outer peripheral portion (NA) formed outside the lighting portion (EA). A first electrode and a second electrode (not shown) are disposed on an entire surface of the substrate 110, and an organic light emitting layer 130 is disposed between the first and second electrodes, thereby forming an organic light emitting device. In the lighting device 100 having such a structure, the organic light emitting layer 130 emits light as a signal is applied to the first and second electrodes of the organic light emitting device, thereby outputting light to the entire surface of the substrate 110.

The organic light emitting layer 130 is formed of an organic light emitting material which outputs white light. For instance, the organic light emitting layer 130 may be formed of a blue (B) organic light emitting layer, a red (R) organic light emitting layer, and a green (G) organic light emitting layer, or may have a tandem structure including a blue (B) light emitting layer and a yellow-green (YG) light emitting layer. However, the organic light emitting layer 130 of the present disclosure is not limited to the structure, but may have various structures.

The organic light emitting layer 130 of the present disclosure may further include an electron injecting layer for injecting electrons to the organic light emitting layer 130, a hole injecting layer for injecting holes to the organic light emitting layer 130, an electron transporting layer for transporting injected electrons to the organic light emitting layer 130, a hole transporting layer for transporting injected holes to the organic light emitting layer 130, and a charge generating layer for generating charges such as electrons and holes.

Since the organic light emitting layer 130 is deposited only on the lighting portion (EA) without being deposited on the outer peripheral portion (NA), the first and second electrodes of the outer peripheral portion (NA) are exposed to the outside. Further, a sealant (not shown) is deposited on an upper surface and side surfaces of the organic light emitting layer 130, and a metallic foil 170 is disposed on the sealant, thereby encapsulating the organic light emitting layer 130 by the sealant.

Hereinafter, the lighting apparatus according to the present disclosure will be explained in more detail with reference to the attached drawings.

Figure 2:
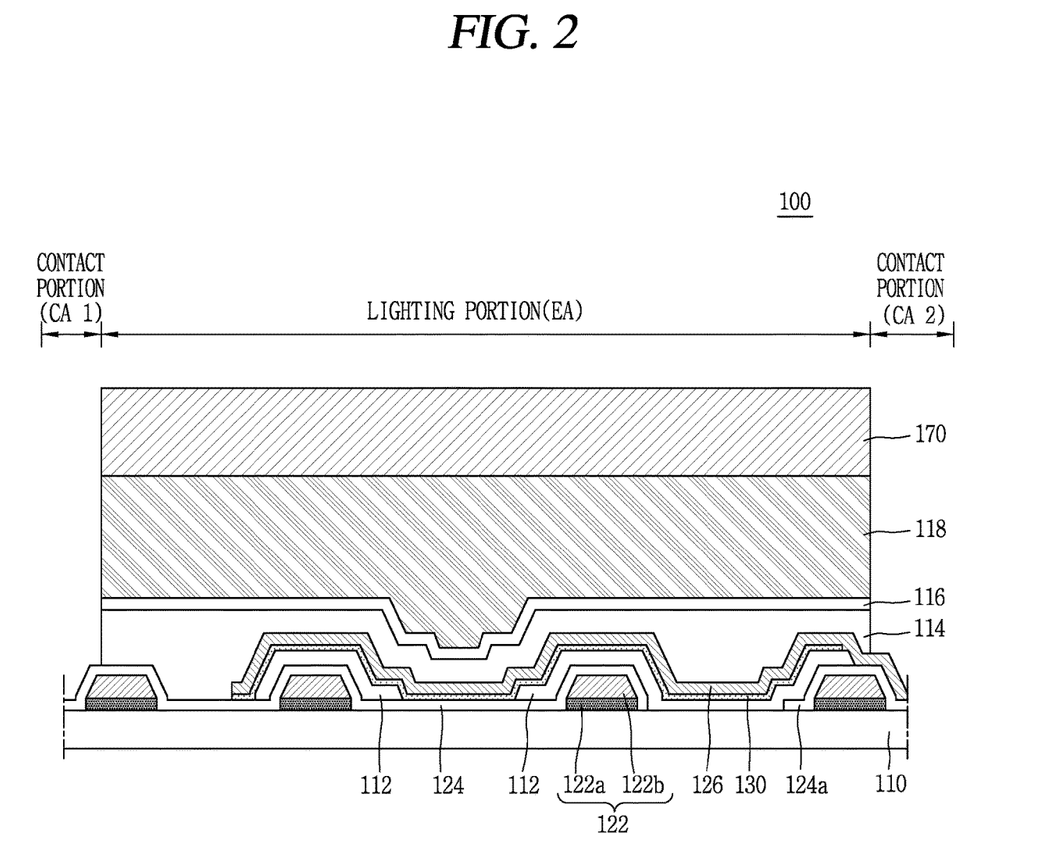
FIG. 2 is a cross-sectional view taken along line 'I-I' in FIG. 1.

FIG. 2 is a cross-sectional view taken along line 'I-I' in FIG. 1, which shows a lighting device according to an aspect of the present disclosure.

As shown in FIG. 2, the lighting device 100 according to an aspect of the present disclosure includes a lighting portion (EA) configured to output light by substantially emitting light, and contact portions (CA1, CA2) arranged along an outer circumference of the lighting portion (EA) and configured to apply a signal to the lighting portion (EA) by electrically connecting an electrode disposed at the lighting portion (EA) to the outside.

A first electrode 124 is disposed on a substrate 110 formed of a transparent material. The substrate 110 may be formed of a hard material such as glass. However, since the substrate 110 is formed of a ductile material such as plastic, the bendable lighting apparatus 100 can be fabricated. Further, in the present disclosure, since the substrate 110 is formed of a ductile material, roll to roll processes can be performed and thus the lighting apparatus 100 can be fabricated rapidly.

The first electrode 124 is formed at the lighting portion (EA) and the first contact portion (CA1), and is formed of a transparent conductive material having high conductivity and a high work function. For instance, in the present disclosure, the first electrode 124 may be formed of one of indium tin oxide (ITO), indium zinc oxide (IZO), a tin oxide-based transparent conductor, a zinc oxide-based transparent conductor, etc. Alternatively, the first electrode 124 may be formed of transparent conductive polymers. A transparent conductive layer 124a is disposed at the second contact portion (CA2). The transparent conductive layer 124a is formed of the same material as the first electrode 124 by the same processes.

An auxiliary electrode 122 is disposed at the lighting portion (EA) and the contact portions (CA1, CA2) of the substrate 110, and is electrically connected to the first electrode 124. The first electrode 124 has an advantage that it is formed of a transparent conductive material to thus transmit light, but has a disadvantage that its electric resistance is much higher than that of a metal. In case of fabricating the lighting apparatus 100 of a large area, a voltage applied to a large lighting region is not uniform due to a large resistance of a transparent conductive material. Such a non-uniform voltage causes the lighting apparatus 100 of a large area not to emit light having a uniform brightness.

The auxiliary electrode 122 is disposed on the entire region of the lighting portion (EA) in a matrix shape, a mesh shape, a hexagonal shape, an octagonal shape, a circular shape, etc. of a thin width, thereby allowing a voltage to be uniformly applied to the first electrode 124 on the entire region of the lighting portion (EA). This enables the lighting apparatus 100 of a large area to emit light having a uniform brightness.

In the drawings, the auxiliary electrode 122 is disposed below the first electrode 124 and the transparent conductive layer 124a. However, the auxiliary electrode 122 may be disposed above the first electrode 124 and the transparent conductive layer 124a. The auxiliary electrode 122 disposed at the contact portion(CA) is used as a transfer path of a voltage to the first electrode 124, and serves as a contact electrode for applying an external voltage to the first electrode 124 by contacting the outside.

The auxiliary electrode 122 is formed of one of Al, Au, Cu, Ti, W, and Mo or an alloy thereof such as a metal having high conductivity. In the drawings, the auxiliary electrode 122 is formed to have a structure of two layers, but may be formed to have a single layer.

A first protection layer 112 is formed on the lighting portion (EA) of the substrate 110. The first protection layer 112 is formed to enclose the auxiliary electrode 122 and the first electrode 124 disposed on the auxiliary electrode 122, thereby reducing a stair-stepped portion due to the auxiliary electrode 122. Accordingly, the first protection layer 112 makes various types of layers be stably formed later without being disconnected from each other.

The first protection layer 112 is formed of an inorganic layer such as $SiO_x$ and $SiN_X$. However, the first protection layer 112 may be formed of an organic layer such as photo-acryl, or may be formed of a plurality of layers having an inorganic layer and an organic layer.

An organic light emitting layer 130 and a second electrode 126 are disposed on the first electrode 124 of the lighting portion (EA). The organic light emitting layer 130, a white organic light emitting layer may be formed to have a red light emitting layer, a blue light emitting layer and a green light emitting layer. Alternatively, the organic light emitting layer 130 may have a tandem structure including a blue light emitting layer and a yellow-green light emitting layer. Further, the organic light emitting layer 130 may further include an electron injecting layer for injecting electrons to the organic light emitting layer 130, a hole injecting layer for injecting holes to the organic light emitting layer 130, an electron transporting layer for transporting injected electrons to the organic light emitting layer 130, a hole transporting layer for transporting injected holes to the organic light emitting layer 130, and a charge generating layer for generating charges such as electrons and holes.

The second electrode 126 may be formed of a metal such as Ca, Ba, Mg, Al and Ag.

The first electrode 124, the organic light emitting layer 130, and the second electrode 126 constitute an organic light emitting device. Here, the first electrode 124 is an anode of an organic light emitting device, and the second electrode 126 is a cathode of an organic light emitting device. If a voltage is applied to the first and second electrodes 124, 126, a hole from the first electrode 124 and an electron from the second electrode 126 are injected to the organic light emitting layer 130. As a result, an exciton is generated in the organic light emitting layer 130. As the exciton decays, generated is light corresponding to an energy difference between a lowest unoccupied molecular orbital (LUMO) and a highest occupied molecular orbital (HOMO) of a light emitting layer. The generated light is emitted towards a lower direction (toward the substrate 110 in the drawings).

Since the first protection layer 112 is disposed above the auxiliary electrode 122 of the lighting portion (EA), the organic light emitting layer 130 above the auxiliary electrode 122 does not directly contact the first electrode 124. Accordingly, an organic light emitting device is not formed above the auxiliary electrode 122. That is, an organic light emitting device inside the lighting portion (EA) is formed only within the auxiliary electrode 122 formed in a matrix shape, for instance.

A second protection layer 114 and a sealant 116 are provided above the substrate 110 where a bank layer 140 has been formed. The second protection layer 114 may be formed of an organic layer such as photo-acryl, or may be formed of an inorganic layer such as SiOx or SiNx. Alternatively, the second protection layer 114 may be formed of a plurality of layers having an inorganic layer and an organic layer.

The sealant 116 protects an organic light emitting device from external moisture or heat, by encapsulating the organic light emitting device. The sealant 116 may be formed of one of an epoxy-based compound, an acrylate-based compound, and an acryl-based compound, etc. Not both the second protection layer 114 and the sealant 116, but one of them may be used.

The second protection layer 114 and the sealant 116 are formed on side surfaces of the organic light emitting layer 130 and the second electrode 126, as well as thereabove, thereby encapsulating the organic light emitting layer 130. Since an organic light emitting material is vulnerable to moisture, it is drastically thermally degraded and easily spreads moisture when coupled to moisture. Accordingly, when the organic light emitting layer 130 is exposed to the outside, moisture is introduced into the lighting portion (EA), resulting in deteriorating the lighting apparatus 100.

The second protection layer 114 and the sealant 116 prevent the organic light emitting layer 130 from being exposed to the outside, by encapsulating the organic light emitting layer 130. This prevents introduction and spread of moisture through the organic light emitting layer 130.

The organic light emitting layer 130, the second electrode 126, the second protection layer 114 and the sealant 116 are not formed on the first electrode 124 and the transparent conductive layer 124a which are formed at the contact portions (CA1, CA2). Accordingly, the first electrode 124 and the transparent conductive layer 124a which are formed at the contact portions (CA1, CA2) are exposed to the outside. As the exposed first electrode 124 and transparent conductive layer 124a are electrically connected to an external power source, a voltage is applied to the first and second electrodes 124, 126.

An adhesive 118 is applied onto the sealant 116, a metallic foil 170 is disposed on the adhesive 118, and the metallic foil 170 is attached to the sealant 116, thereby sealing the lighting apparatus 100. The adhesive 118 may be formed of a photopolymer adhesive or a thermosetting adhesive.

Figure 3:
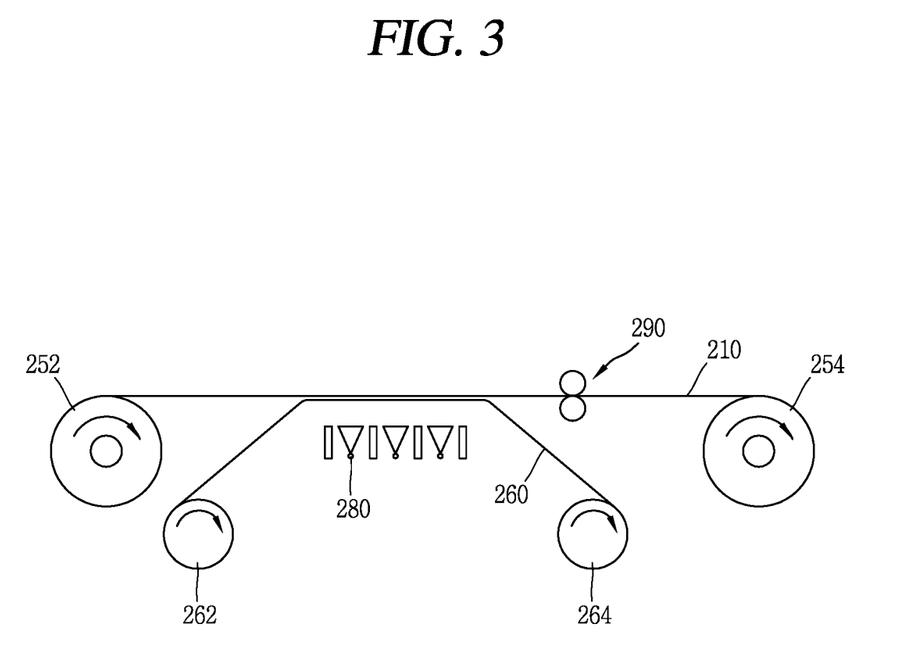
FIG. 3 is a schematic view showing a concept of a roll fabricating apparatus according to the present disclosure.
Figure 4:
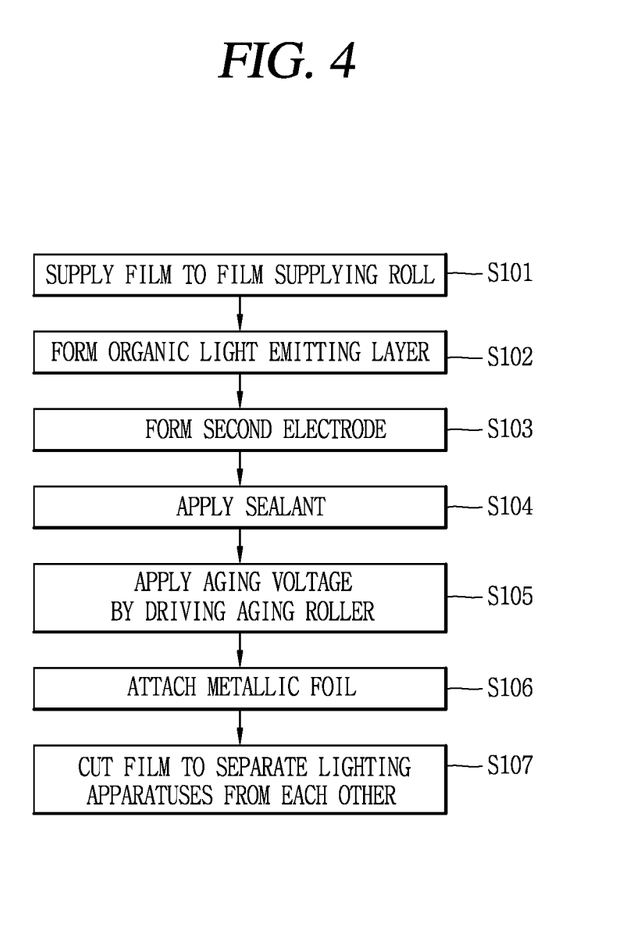
FIG. 4 is a flow chart showing a method for fabricating a lighting apparatus according to the present disclosure.

FIG. 3 is a schematic view showing a concept of a roll fabricating apparatus according to the present disclosure, and FIG. 4 is a flowchart showing a method for fabricating a lighting device using a roll-to-roll fabricating apparatus according to the present disclosure.

As shown in FIG. 3, the roll-to-roll fabricating apparatus according to the present disclosure includes a film supplying roll 252 for supplying a ductile film 210 such as a plastic film, a film collecting roll 254 for collecting the film 210, a mask supplying roll 262 for supplying an open mask 260, a mask collecting roll 264 for collecting the open mask 260, a deposition unit 280 for forming a layer by depositing an organic material or a metal, and an aging unit 290 disposed at a rear end of the deposition unit 280 and configured to perform an aging process with respect to an organic light emitting layer formed at the deposition unit 280 by applying an aging voltage to the organic light emitting layer.

As shown in FIG. 4, the ductile film 210 such as a plastic film is supplied to the film supplying roll 252, and then is arranged on the film supplying roll 252 and the film collecting roll 254 (S101).

A plurality of lighting devices may be formed on the film 210, a mother substrate. Further, an auxiliary electrode 122, a first electrode 124, a transparent conductive layer 124a and a first protection layer 112 may be formed at the film 210 by previous processes. The auxiliary electrode 122, the first electrode 124 and the transparent conductive layer 124a are formed by depositing a transparent conductive material such as ITO and IZO and a metal, and then by etching the transparent conductive material or the metal. And the first protection layer 112 is formed by depositing an inorganic insulating material and/or an organic insulating material, and then by etching the inorganic insulating material and/or the organic insulating material.

Then, the film 210 where the auxiliary electrode 122, the first electrode 124, the transparent conductive layer 124a and the first protection layer 112 have been formed is transferred to the film collecting roll 254 from the film supplying roll 252, and the open mask 260 is transferred to the mask collecting roll 264 from the mask supplying roll 262. Then, the open mask 260 is aligned with the film 210 in an attached state. Although not shown, an open region is formed at the open mask 260, and the open region is aligned with the lighting portion of the lighting apparatus formed at the film 210.

In the aligned state of the open mask 260 with the film 210, an organic light emitting material is deposited on the lighting portion of the film 210 by the deposition unit 280, thereby forming the organic light emitting layer 130 (S102).

Then, in the aligned state of the open mask 260 with the film 210, a metal and a sealant are deposited on the lighting portion of the film 210 by the deposition unit 280, thereby forming the second electrode 126 and the sealant 116 (S103,S104).

Then, an aging voltage is applied to the organic light emitting layer 130 by using an aging unit 260, thereby aging the organic light emitting layer 130(S105).

An organic light emitting material used as the organic light emitting layer 130 has a short lifespan, is vulnerable to moisture or oxygen, and may cause damage when a high voltage or a high current is applied thereto. Further, since an interfacial characteristic between the electrode and the organic light emitting layer 130 is not good, a device characteristic is unstable. In this case, the device characteristic becomes stable if a completed lighting device is used for a long time. Also, as impurities are deposited in the organic light emitting layer 130 when the first and second electrodes 124, 126 are formed, a light emitting characteristic and a color sense of an organic material may be lowered.

In order to solve such a problem, an aging voltage of a high voltage should be applied to the organic light emitting layer 130 to perform an aging process with respect to the organic light emitting layer 130 within a short time. Such an aging process makes only a region where impurities have occurred dark-spotted, thereby preventing the lighting device from being entirely dark-spotted or non-driven.

Here, the aging voltage may be larger than a voltage applied to the first and second electrodes 124, 126 of the lighting device 100, or may be an inverse voltage to the voltage applied to the first and second electrodes 124, 126 of the lighting device 100.

The aging voltage is applied through an aging pad formed at the lighting apparatus 100, and the aging pad is formed on an outer peripheral region of the lighting device 100 on the film 210. When the lighting device 100 is completed and separated from the film 210, the aging pad is removed. The aging pad is connected with the lighting apparatus 100 as an integrated body during manufacturing processes, but is not a component of the completed lighting apparatus 100.

Figure 5A:
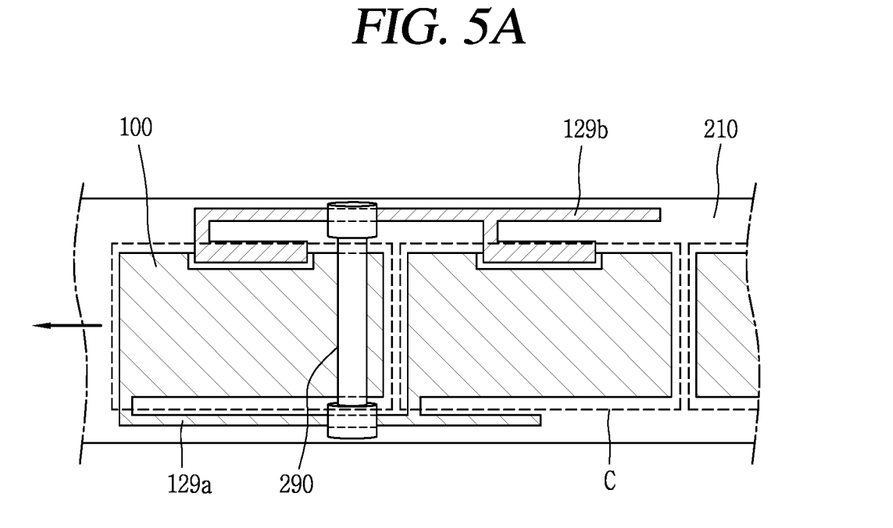
FIGS. 5A and 5B are schematic views showing a film where a plurality of lighting devices are formed.
Figure 5B:
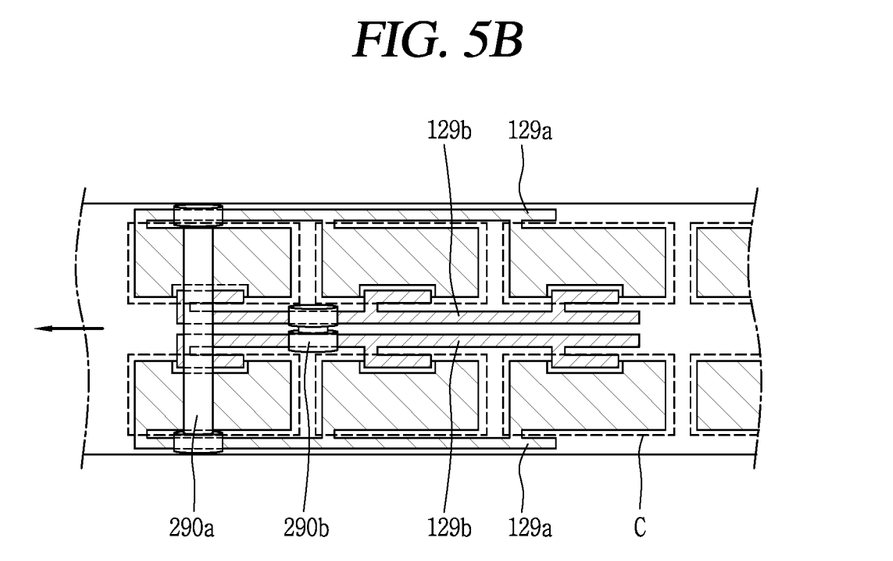

FIGS. 5A and 5B show a method to apply an aging voltage by contacting an aging unit 260 to an aging pad of the film 210 where a lighting device and the aging pad have been formed.

As shown in FIG. 5A, a plurality of lighting devices 100 are formed on the film 210 in a line in a lengthwise direction. A first aging pad 129a and a second aging pad 129b are formed at regions between two edges of the film 210 and the lighting devices 100. Here, the plurality of lighting devices arranged in a lengthwise direction of the film 210 share the first and second aging pads 129a, 129b. That is, the first and second aging pads 129a, 129b are arranged in a lengthwise direction of the film 210, and are electrically connected to the plurality of lighting devices. Accordingly, an aging voltage is applied to the plurality of lighting devices 100 through one first aging pad 129a and one second aging pad 129b.

An aging voltage is applied to the first and second aging pads 129a, 129b after the film 210 is transferred by a predetermined distance after the organic light emitting layer 130 and the second electrode 126 have been formed by the deposition unit 280. Accordingly, the number of the lighting devices 100 which share the first and second aging pads 129a, 129b corresponds to the number of the lighting devices 100 formed on the film 210 corresponding to a region between the deposition unit 280 and the aging unit 290 shown in FIG. 3.

The first aging pad 129a is connected to the first electrode 124 of the lighting device 100, and the second aging pad 129b is connected to the second electrode 126 of the lighting device 100, thereby applying an aging voltage to the first and second electrodes 124, 126.

The first aging pad 129a may be separately formed from the first electrode 124 and electrically connected to the first electrode 124. Alternatively, the first aging pad 129a may be integrally formed with the first electrode 124. And the second aging pad 129b may be separately formed from the second electrode 126 and electrically connected to the second electrode 126. Alternatively, the second aging pad 129b may be integrally formed with the second electrode 126. Alternatively, the second aging pad 129b may be integrally formed with the transparent conductive layer 124a.

As shown in FIG. 5B, the plurality of lighting devices 100 are formed in a plurality of lines, in a lengthwise direction of the film 210. Here, the first aging pads 129a are formed at regions between two edges of the film 210 and the lighting devices 100, and the second aging pad 129b is formed at a region between the lighting devices 100. Here, the plurality of lighting devices 100 arranged in a lengthwise direction of the film 210 share the first and second aging pads 129a, 129b.

The aging unit 290 of the roll-to-roll fabricating apparatus contacts the first and second aging pads 129a, 129b, thereby applying an aging voltage to the first and second electrodes 124, 126 of the lighting device 100 through the first and second aging pads 129a, 129b.

Figure 6:
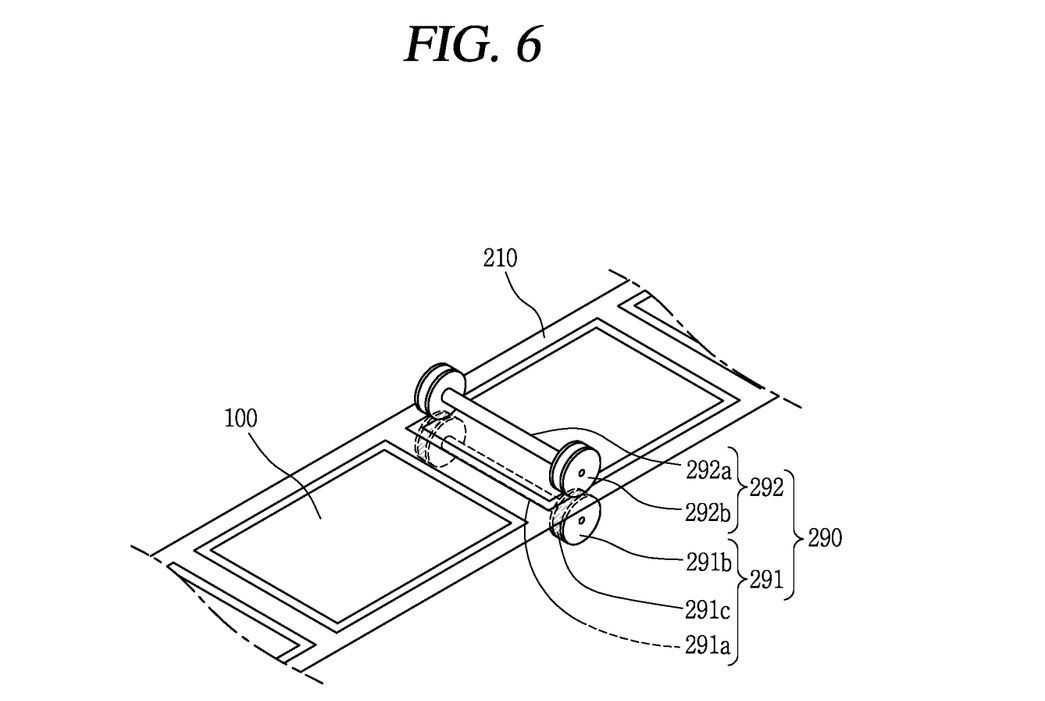
FIG. 6 is a perspective view showing a structure of an aging unit according to the present disclosure.

As shown in FIG. 6, the aging unit 290 includes an aging roller 291 and a supporting roller 292. The aging roller 291 includes an aging rotation shaft 291a, and aging roll heads 291b disposed at both ends of the aging rotation shaft 291a. The supporting roller 292 includes a supporting rotation shaft 292a, and supporting roll heads 292b disposed at both ends of the supporting rotation shaft 292a. Metallic patterns 291c are formed at the aging roll heads 291b along a circumference, and are electrically connected to an external power source.

As shown in FIG. 3, the aging unit 290 is disposed between the film supporting roll 252 and the film collecting roll 254. The supporting roller 292 of the aging unit 290 contacts an upper surface of the film 210 (i.e., a non-depositing surface) which is transferred after the organic light emitting layer 130 and the second electrode 126 are formed by the deposition unit 280, and the aging roller 291 of the aging unit 290 contacts a lower surface of the film 210 (i.e., a depositing surface).

Once a metallic pattern 292c of the aging roll head 291b of the aging roller 291 contacts the aging pads 129a, 129b formed on a lower surface of the film 210, an aging voltage is applied to the first and second electrodes 124, 126 of the lighting device 100 from an external voltage source, via the metallic pattern 292c and the aging pads 129a, 129b. As a result, the organic light emitting layer 130 undergoes an aging process.

Since the aging roller 291 and the supporting roller 292 do not have an own driving force applied thereto, they are rotated by a force with the film 210 transferred. As the aging roller 291 and the supporting roller 292 are rotated, a contact time between the metallic pattern 292c of the aging roll head 291b and the aging pads 129a, 129b is time for which an aging voltage is applied to the organic light emitting layer 130.

As shown in FIG. 5B, when the plurality of lighting devices 100 which are in a plurality of lines are formed on the film 210 in a lengthwise direction of the film 210, an aging voltage may be applied to the lighting devices 100 by using two or more aging units 290a, 290b.

Referring back to FIG. 4, after aging the organic light emitting layer 130, the metallic foil 170 is attached to an upper part of the sealant 116 (S106). Then, the film 210 is cut along a cutting line (C) to separate the lighting devices 100 into each lighting device 100 (S107).

The cutting line (C) may be formed at a region between the lighting devices 100 and both edges of the film 210 (shown in FIG. 5A). Alternatively, the cutting line (C) may be formed at a region between the lighting devices 100 and both edges of the film 210, and at a region between the lighting devices 100 disposed at a different row (shown in FIG. 5B). The first and second aging pads 129a, 129b are removed by a cutting along the cutting line (C), thereby not remaining at the completed lighting devices 100.

In the present disclosure, the lighting apparatus 100 is fabricated by a roll to roll method using a roll fabricating apparatus, thereby fabricating the lighting devices 100 in real time in an inline manner. Further, in the present disclosure, since an aging process of the organic light emitting layer 130 of the lighting devices 100 is performed consecutively and in real time, by the roll fabricating apparatus by the aging unit 290 having rollers. This may allow the lighting apparatus 100 to be fabricated more rapidly, which will be explained in more detail.

Figure 7:
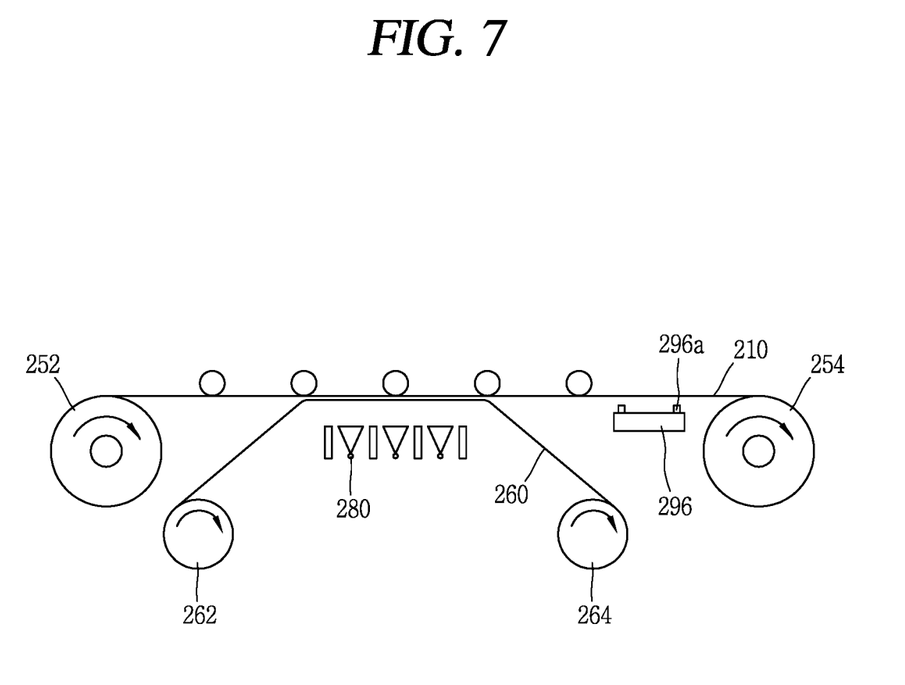
FIG. 7 is a schematic view showing a roll fabricating apparatus having a jig-type aging unit.

FIG. 7 is a view showing a roll-to-roll fabricating apparatus having a jig-type aging unit 296, which is different from a roller-type aging unit.

As shown in FIG. 7, the film 210 is also transferred to the film collecting roll 254 from the film supplying roll 252, and an organic light emitting material and a metal are also deposited by the deposition unit 280 in the roll fabricating apparatus having such a structure. Accordingly, the organic light emitting layer 130 and the second electrode 126 are formed by a real-time inline process. Further, in the roll fabricating apparatus having such a structure, a jig-type aging unit 296 having a contact pin 296a which contacts an aging pad of the lighting device 100 is provided at a rear end of the deposition unit 280. Accordingly, the organic light emitting layer 130 formed at a lighting device of the film 210 transferred from the film supplying roll 252 to the film collecting roll 254 may undergo an aging process.

In the roll fabricating apparatus having such a structure, the aging unit 296 is formed as a quadrangular jig-type having a predetermined size. Accordingly, an aging voltage is applied by contacting contact pins 296a of the aging unit 296 to the aging pads of the lighting apparatus 100 formed at a predetermined region of the film 210 which is transferred, by upward-moving the aging unit 296. Once the aging process with respect to the lighting apparatus 100 formed at a predetermined region of the film 210 is terminated, the aging unit 296 is downward-moved. If the next lighting devices 100 is transferred as the film 210 is transferred, the aging unit 296 is upward-moved again to apply an aging voltage to the lighting devices 100.

In the roll fabricating apparatus having such a structure, the film 210 should be stopped from being transferred so that the fixed aging unit 296 may contact the aging pads of the lighting apparatus 100. Further, in case of upward-moving or downward-moving the aging unit 296 after the aging process with respect to the lighting apparatus 100 of a predetermined region, i.e., a region to which an aging voltage is applied by the aging unit 296), the film 210 should be also stopped from being transferred. Accordingly, in the roll fabricating apparatus having such a structure, it is impossible to perform an aging process with respect to the lighting devices 100 in real time and consecutively while the film 210 is being transferred.

On the other hand, in the present disclosure, when the film 210 is transferred, the rollers 291, 292 of the aging unit 290 are rotated. Accordingly, the aging roller 291 is always in a contacted state with the aging pads 129a, 129b of the film 210, thereby applying an aging voltage to the lighting apparatus 100. This may allow the organic light emitting layer 130 and the second electrode 126 to be formed, and may allow an aging process of the organic light emitting layer 130 to be performed in real time and consecutively. As a result, entire fabrication processes of the lighting apparatus 100 are simplified, resulting in fabricating the lighting apparatus 100 rapidly and cheaply.

As the present features may be embodied in several forms without departing from the characteristics thereof, it should also be understood that the above-described aspects are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. A method for fabricating a plurality of lighting devices, comprising:

supplying a film having a first electrode and a first aging pad on a plurality of regions of the film;

forming an organic light emitting layer, a second electrode and a second aging pad on the plurality of regions of the film while being transferred between a film supplying roll and a mask roll in real time;

consecutively applying an aging voltage to the organic light emitting layer on the film transferred between the film supplying roll and the mask roll, wherein the aging voltage is applied by an aging unit having an aging roller contacting the first and second aging pads of the lighting devices and a supporting roller contacting the aging roller to make a region of the organic light emitting layer having an impurity dark-spotted, and wherein the film is disposed between the aging roller and the supporting roller, and the aging roller keeps in contact with the first and second aging pads by rotating the aging roller and the supporting roller while the film is transferred;

and separating the film into the plurality of lighting devices.

2. The method of claim 1, wherein the forming an organic light emitting layer, a second electrode and a second aging pad comprises disposing an open mask at a front surface of the film.

3. The method of claim 2, wherein the open mask is disposed by being synchronized with the film transferred by a roll.

4. The method of claim 2, wherein the consecutively applying an aging voltage is performed by contacting the first and second aging pads on the film transferred between the aging roller and the supporting roller to a metallic pattern of the aging roller.

5. The apparatus of claim 2, wherein the disposing an open mask at a front surface of the film is performed by a mask supplying roll.

6. The apparatus of claim 5, further comprising collecting the open mask by a mask collecting roll after the disposing the open mask at the front surface of the film.

7. The method of claim 1, wherein the separating the film is performed by cutting regions between the lighting devices and the first and second aging pads to separate the first and second aging pads from the lighting devices.

8. The apparatus of claim 1, wherein the first and second aging pads are disposed at an outer peripheral region of the lighting devices.

9. The apparatus of claim 1, wherein the first aging pad is disposed at an outer peripheral region of the lighting devices and the second aging pad is disposed between the lighting devices.

* * * * *